United States Patent [19]
Kajiwara

[11] Patent Number: 5,990,505
[45] Date of Patent: Nov. 23, 1999

[54] SOLID-STATE IMAGE PICKUP DEVICE

[75] Inventor: Kenji Kajiwara, Sagamihara, Japan

[73] Assignee: Canon Kabushiki Kaisha, Tokyo, Japan

[21] Appl. No.: 09/027,294

[22] Filed: Feb. 20, 1998

[51] Int. Cl.[6] .................................. H01L 31/00
[52] U.S. Cl. .................. 257/291; 257/292; 257/442; 257/446; 257/433
[58] Field of Search .................... 257/232, 233, 257/234, 446, 292, 291, 294, 59, 72, 442, 433

[56] References Cited

U.S. PATENT DOCUMENTS 4,113,512  9/1978  Ayers et al. ............................ 148/1.5
5,606,194  2/1997  Lebrun et al. .......................... 257/433

*Primary Examiner*—William Mintel
*Attorney, Agent, or Firm*—Fitzpatrick, Cella, Harper & Scinto

[57] ABSTRACT

A highly reliable solid-state image pickup device with one- or two-dimensionally arranged connecting portions, capable of avoiding corrosion of wirings resulting from chipping of the substrates and eliminating image defect, is achieved by arranging plural substrates, each bearing a plurality of image taking elements, in a planar manner on a supporting substrate and filling the connecting portions of thus arranged substrates with an organic or inorganic material, of which content in chlorine or in each of sodium and potassium does not exceed 200 ppm.

26 Claims, 12 Drawing Sheets

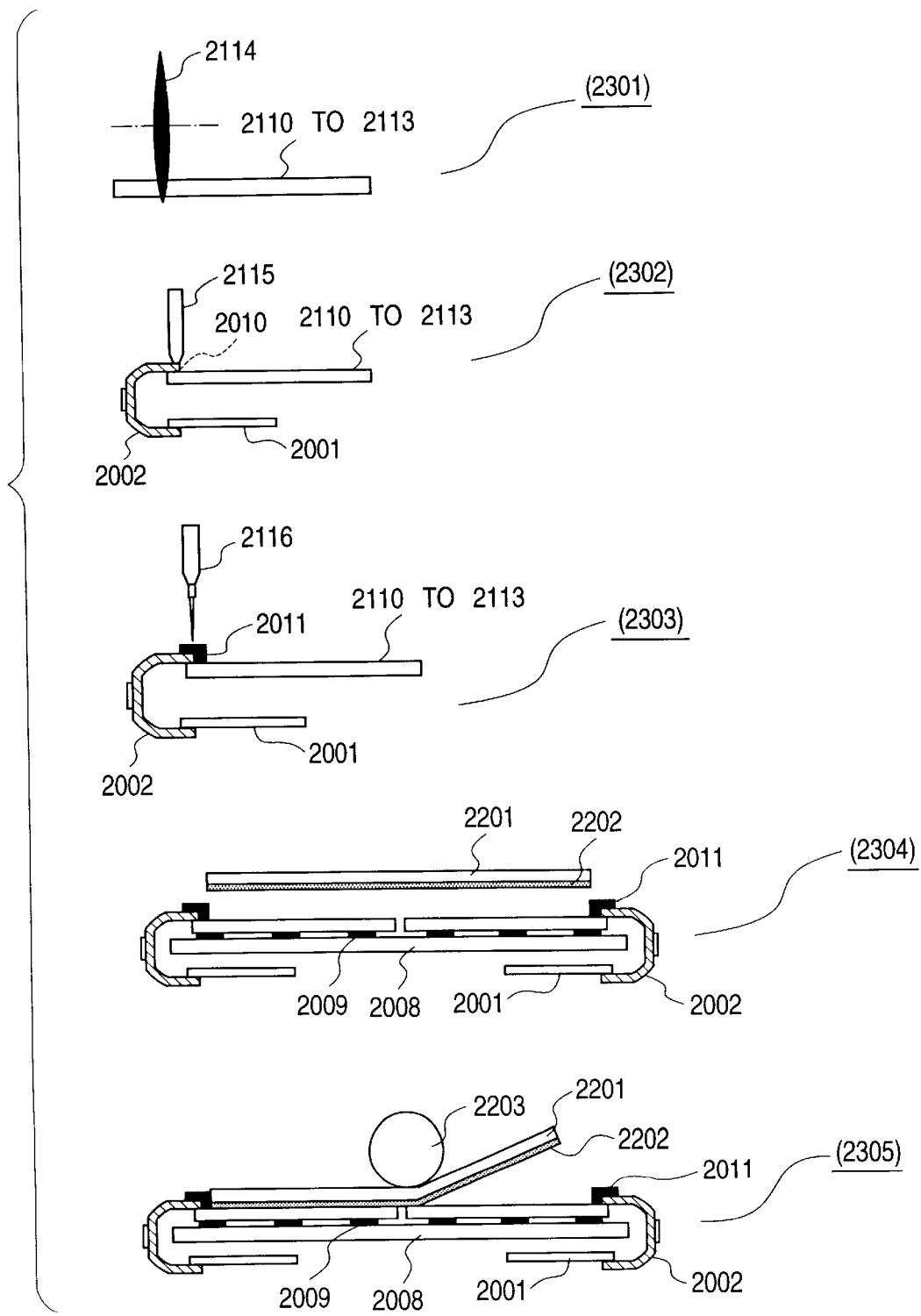

SOLID-STATE IMAGE PICKUP DEVICE

BACKGROUND OF THE INVENTION

1. Field of the Invention

The present invention relates to a one-dimensional or two-dimensional solid-state image pickup device, adapted for use in a facsimile apparatus, a digital copying machine or an X-ray image taking apparatus.

2. Related Background Art

In the image reading system of the facsimile apparatus, the digital copying machine or the X-ray image taking apparatus, there has generally been employed a system consisting of a combination of a reduction optical system and a CCD sensor. Also in recent years, owing to the development of photoelectric converting semiconductor materials represented by hydrogenated amorphous silicon (hereinafter represented as a-Si), there has been proposed a contact sensor containing the photoelectric converting elements or such elements and a signal processing unit on a large-sized substrate and adapted to read the information from a source with a real-size optical system, and such contact sensor is being commercialized particularly in the one-dimensional sensor. In particular, since a-Si can be utilized not only as the photoelectric converting material but also as the semiconductor material for a thin film field effect transistor (hereinafter represented as TFT), it allows to simultaneously form a photoelectric converting semiconductor layer and a semiconductor layer of the TFT on a same substrate, thereby simplifying the structure.

However the increase in the size of the substrate may result in a lowered production yield with respect to the number of processed substrates, because the satisfactory or defective product can only be judged after the final stage of the manufacturing process. Also there is required a large investment in the manufacturing equipment since exclusive process and manufacturing line, including the film formation and the photoresist process, have to be newly established corresponding to the substrate size. Based on such viewpoint, the realization of economically acceptable product poses a difficult aspect. In particular, an improvement in the manufacturing yield has to be considered sufficiently in case of the solid-state image pickup device of a large image reading area, since such device cannot be obtained, unlike the line sensors, in a large number from a single substrate.

For this reason, attention is being attracted, for the purpose of improving the manufacturing yield, to a method of obtaining a large-sized device by arranging a plurality of small-sized substrates. FIGS. 1A and 1B show an example of the solid-state image pickup device forming by arranging a plurality (2×2=4 units in the illustrated example) of small-sized substrates. In these drawings there are shown circuit boards 2001, flexible circuit boards 2002, lead electrodes 2010 formed on the sensor substrates, and sealant 2011.

The sealant 2011 is applied at the junction of the lead electrodes 2010 and the flexible circuit boards 2002, for the purpose of preventing corrosion of the lead electrodes 2010, and is generally composed of silicone resin. There are also shown sensor substrates 2003–2006 bearing thereon sensor elements 2007 (represented by sensor areas), a base member 2008 for supporting the sensor substrates 2003–2006, and an adhesive material 2009 for fixing the sensor substrates 2003–2006 to the base member 2008. The sensor substrates 2003–2006 are fixed to the base member 2008, with such alignment that the pitch of the pixels is matched two-dimensionally.

FIG. 2 shows an example of the process for preparing the solid-state image pickup device formed by arranging a plurality of small-sized substrates as shown in FIGS. 1A and 1B. In a step (2101), four sensor substrates 2110–2113 prepared by a thin-film semiconductor process are sliced into a desired size by a rotary diamond blade 2114.

Then, in a step (2102), the circuit board 2001 is connected, by suitable jointing means 2115 and through the flexible circuit board 2002, to the lead electrode portion 2010 of the sensor substrate 2110–2113 prepared in the predetermined size. In a next step (2103), the sealant 2011 is coated by a dispenser 2116 so as to cover the junction portion of the lead electrode portion 2010 and the flexible circuit board 2002.

Then, in a step (2104), the sensor substrates after sealing are mutually so aligned that the pitch of the pixels matches two-dimensionally, and the substrates are placed on and fixed to the base member 2008 coated with the adhesive material 2009 in advance. (In FIG. 2, the sensor elements 2007 are omitted from the illustration.)

In case the above-mentioned solid-state image pickup device is used as an X-ray image pickup device, there is adopted a configuration in which the X-ray is converted by a fluorescent plate into a sensitive wavelength range of the sensor, such as visible light, and such converted light is read by the sensor. FIGS. 3A and 3B show an example of the X-ray image pickup device, wherein shown are circuit boards 2001; flexible circuit boards 2002; lead electrode portions 2010 provided on sensor substrates 2110–2113; and a sealant 2011.

The sealant 2011 is applied at the junction of the lead electrode portion 2010 and the flexible circuit board 2002, for the purpose of preventing corrosion of the lead electrodes 2010, and is generally composed of silicone resin. There are also shown sensor substrates 2003–2006 bearing thereon sensor elements 2007, a base member 2008 for supporting the sensor substrates 2003–2006, and an adhesive material 2009 for fixing the sensor substrates 2003–2006 to the base member 2008. The sensor substrates 2003–2006 are fixed to the base member 2008, with such alignment that the pitch of the pixels is matched two-dimensionally. There are further shown a fluorescent plate 2201 for converting the X-ray into the visible light, and an adhesive material for adhering the fluorescent plate 2201 to the sensor substrates 2003–2006. In FIG. 3A, the fluorescent plate 2201 is partially cut off at the lower right corner for the purpose of showing the structure thereunder. The fluorescent plate 2201 may be provided over the entire area corresponding to the area of the photoelectric converting elements 2007.

FIG. 4 shows an example of the process for preparing the X-ray image pickup device shown in FIGS. 3A and 3B. In a step (2301), sensor substrates 2110–2113 prepared by a thin-film semiconductor process are sliced into a desired size by a rotary diamond blade 2114. Then, in a step (2302), the circuit boards 2001 are connected, by suitable jointing means 2115 and through the flexible circuit boards 2002, to the lead electrode portions 2010 of the sensor substrate 2110–2113 prepared in the predetermined size.

In a next step (2303), the sealant is coated by a dispenser 2116 so as to cover the junction portion of the flexible circuit board 2002 connected onto the lead electrode portion 2010. Then, in a step (2304), the sensor substrates 2110–2113 after sealing are mutually so aligned that the pitch of the pixels matches two-dimensionally, and the substrates are placed on and fixed to the base member 2008 coated with the adhesive material in advance. Then the fluorescent plate 2201, coated with the adhesive material 2202 over the entire area for example by spraying, is placed on the sensor substrates 2110–2113. Then, in a step (2305), adhesion is achieved by a constant pressure applied by a roller 2203. In FIG. 4, the photoelectric converting elements (sensor elements) 2007 are omitted from the illustration.

In such solid-state image pickup device formed by arranging plural small-sized substrates, the image pickup device of pseudo single substrate is formed by matching the pitch of the pixels in two-dimensional directions. Consequently it is possible, when the small-sized substrate is completed, to inspect the electrical characteristics thereof, thereby judging each substrate satisfactory or defective, and to improve the yield at the next assembling step. On the other hand, it is necessary to pay attention, in the cutting process in the step (2101) or (2301) shown in FIG. 2 or FIG. 4, not only to the dimension precision and the positional error resulting from the burrs generated at the cutting, but also to the destruction of the elements resulting from the chipping at the cut portion and the corrosion.

FIG. 5 shows a connecting portion between the two neighboring substrates in a schematic plan view, wherein shown are sensor pixel portions 2401; thin film transistor portions 2402; gate lines 2403; and signal lines 2405. The interval of the gate lines or the signal lines corresponds to the pitch a of the pixels. In order to connect the neighboring substrates while matching the pitch of the pixels as shown in FIG. 5, the distance β from the end 2406-1 or 2406-2 of each substrate to the gate line 2403-1 or 2403-2 has to satisfy a relation β<α/2. In recent years, because of the requirement for a finer image and the advancement in the semiconductor technology, the pixel pitch of the solid-state image pickup device is in the order of several tens of microns to several hundreds of microns. With such miniaturization of the pixels, the distance β from the end of the substrate to the gate line becomes shorter so that the size of chipping at the substrate end detrimentally affect the structure of the device.

FIG. 6 shows an example of a chipping at the connecting portion of the two neighboring substrates (upper part being a schematic plan view while lower part being a schematic magnified cross-sectional view), wherein shown are a chipped portion 2501; an insulating film (silicon nitride film) 2502; a protective film (polyimide film) 2503; and a transparent insulating substrate 2505. The insulating film 2502 and the protective film 2503 are normally so formed as to cover sensor pixel portions 2401, thin film transistor portions 2402, gate lines 2403 and signal lines 2405 to prevent intrusion of moisture and impurity ions such as of sodium, potassium and chlorine, thereby protecting the metal wirings from corrosion. However, if the substrate is chipped as illustrated to a position close to the gate line, the moisture and the impurity ions intrude at the interface of the insulating film 2502 and the transparent insulating substrate 2505, thereby inducing corrosion of the wirings and eventually leading to the breakdown thereof. This causes the lack of a line in the image, thus significantly deteriorating the image quality.

At the process of producing the X-ray image pickup device, in a state that the flexible circuit board is connected onto the lead electrode portion of the sensor substrate, a sealing material is painted by a dispenser to cover the junction portion. Then, the four sensor substrates after sealing are mutually so aligned that the pitch of the pixels matches in the two-dimensional directions, and are placed on and fixed to the base member on which the adhesive material is painted previously. And then, a fluorescent plate painted with the adhesive material over the entire area thereof for example by spraying is placed on the sensor substrates. And, pressing thereon at a constant pressure by a roller, the fluorescent plate is bonded to the base plate. In this operation, the excessive adhesive material is leaked out from the ends of the fluorescent plate, thereby further covering the lead electrode portions already covered with the sealant. As a result, the lead electrode portions are twice sealed.

The lead electrode portion or the surface thereof is covered with an Al film, or formed with Al or an Al alloy, and is therefore not protected against the moisture or the impurity ions such as sodium, potassium or chlorine. For this reason, the lead electrode portion is sealed, in a similar manner as explained above, by organic resin with low impurity ions, such as silicone resin or epoxy resin. Such resin is initially liquid and is solidified by a chemical reaction induced by the addition of heat, moisture, ultraviolet light or a hardening agent, and is provided with a considerable adhering power. Also between the sensor substrates and the fluorescent plate there is employed an adhesive material, which is required:

1. to be optically transparent;
2. to have satisfactory adhesion to and to be hardly peelable from the substrates;
3. to be of a low viscosity in order not to include bubbl es between the substrates; and
4. to be hardenable at the room temperature, in consideration of peeling of the substrates by the difference in the thermal expansion coefficients.

These requirements apply also to the sealing resin for the lead electrode portions, so that a same material may be employed for both purposes.

SUMMARY OF THE INVENTION

An object of the present invention is to solve the corrosion of the wirings resulting from chipping of the substrate, thereby providing a highly reliable solid-state image pickup device, with one- or two-dimensionally arranged connecting portions, without image defect.

Another object of the present invention is to achieve simplification of the manufacturing process, thereby providing a low cost solid-state image pickup device, with one- or two-dimensionally arranged connecting portions.

Still another object of the present invention is to provide a solid-state image pickup device provided with plural substrates, each bearing a plurality of photoelectric converting elements, and arranged in a planar manner on a supporting substrate for supporting the first-mentioned substrates, and the junctions of thus arranged substrates are filled with an organic or inorganic material of which content in chlorine or in sodium and potassium does not exceed 200 ppm.

Still another object of the present invention is to provide a solid-state image pickup device in which a fluorescent member for converting the X-ray into the visible light is adhered with an adhesive material or a viscous material onto a sensor substrate bearing a plurality of photoelectric converting elements and thin film transistors, wherein an electrical connecting portion between the lead electrode portion, provided on the substrate for the scanning operation and for the output of the image signal, and an integrated circuit board is sealed with an adhesive material or a viscous material, of which content in chlorine or in sodium and potassium does not exceed 200 ppm.

Still another object of the present invention is to provide a solid-state image pickup device in which, between plural substrates arranged in mutually adjacent manner and each containing a plurality of photoelectric converting elements, there is provided a filling material of which content in an element selected from a group consisting of chlorine, sodium and potassium does not exceed 200 ppm.

Still another object of the present invention is to provide a solid-state image pickup device provided, at the light entrance side of a substrate provided with a plurality of photoelectric converting elements, with a wavelength converting member which is adhered with an adhesive material or a viscous material of which content in an element selected from a group consisting of chlorine, sodium and potassium does not exceed 200 ppm.

Still another object of the present invention is to provide a solid-state image pickup device provided with plural substrates, each bearing a plurality of photoelectric converting elements, and arranged on a supporting substrate, wherein, between thus arranged substrates, there is provided an organic or inorganic filling material of which content in chlorine does not exceed 200 ppm.

Still another object of the present invention is to provide a solid-state image pickup device provided with plural substrates, each bearing a plurality of photoelectric converting elements, and arranged on a supporting substrate, wherein, between thus arranged substrates, there is provided an organic or inorganic filling material of which content in each of sodium and potassium does not exceed 200 ppm.

Still another object of the present invention is to provide a solid-state image pickup device in which, on a sensor substrate bearing a plurality of photoelectric converting elements and thin film transistors, a wavelength converting member for converting the X-ray into the sensitive wavelength range of the photoelectric converting elements is adhered with an adhesive material or a viscous material, wherein an electrical connecting portion between the lead electrode portion, provided on the substrate for the scanning operation and for the output of the image signal, and an integrated circuit board is sealed with the above-mentioned adhesive or viscous material, of which content in chlorine does not exceed 200 ppm.

Still another object of the present invention is to provide a solid-state image pickup device in which, on a sensor substrate bearing a plurality of photoelectric converting elements and thin film transistors, a wavelength converting member for converting the X-ray into the sensitive wavelength range of the photoelectric converting elements is adhered with an adhesive material or a viscous material, wherein an electrical connecting portion between the lead electrode portion, provided on the substrate for the scanning operation and for the output of the image signal, and an integrated circuit board is sealed with the above-mentioned adhesive or viscous material, of which content in each of sodium and potassium does not exceed 200 ppm.

BRIEF DESCRIPTION OF THE DRAWINGS

FIGS. 2, 4, 9, 12 and 15 are schematic views showing examples of the preparation process for the solid-state image pickup device.

DETAILED DESCRIPTION OF THE PREFERRED EMBODIMENTS

Figure 7:
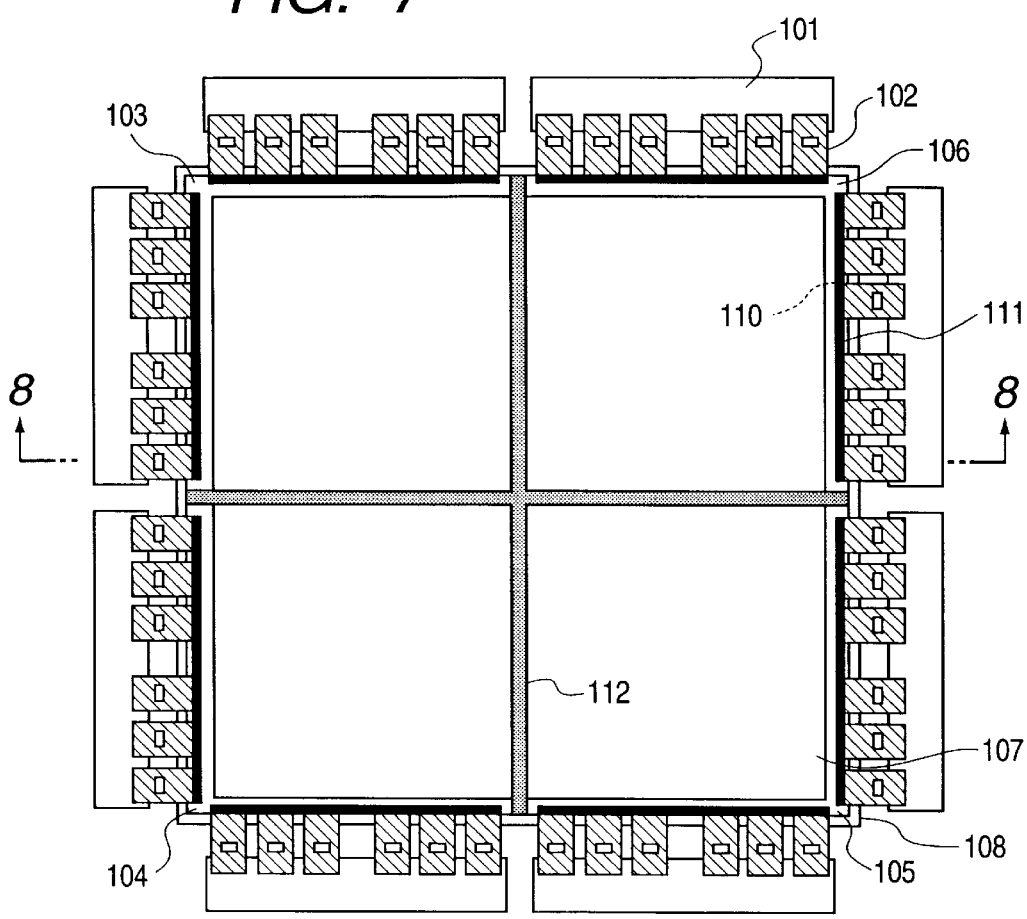
Figure 8:
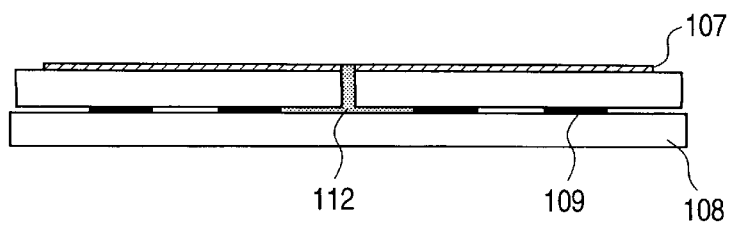

FIG. 7, is a plan view of a preferred embodiment of the solid-state image pickup device of the present invention, and FIG. 8 is a schematic cross-sectional view thereof, wherein shown are circuit boards 101, flexible circuit boards 102, lead electrode portions 110 provided on the sensor substrates, and a sealant 111. The sealant 111 is used at the junction of the flexible circuit board 102 and the lead electrode portion 110 for preventing the corrosion thereof, and is generally composed of silicone resin. There are further shown four sensor substrates 103–106 on which sensor elements 107 are formed, a base member 108 for supporting the substrates 103–106, and an adhesive material 109 for fixing the sensor substrates 103–106 to the base member 108. The sensor substrates 103–106 are so aligned that the pitch of the pixels matches in the two-dimensional directions, and are fixed to the base member 108. A filler material 112 is used for filling the connecting portions of the sensor substrates 103–106 (gaps between the neighboring sensor substrates 103–106). The filler material 112 is composed, for example, of organic resin of which chlorine content does not exceed 200 ppm.

Figure 9:
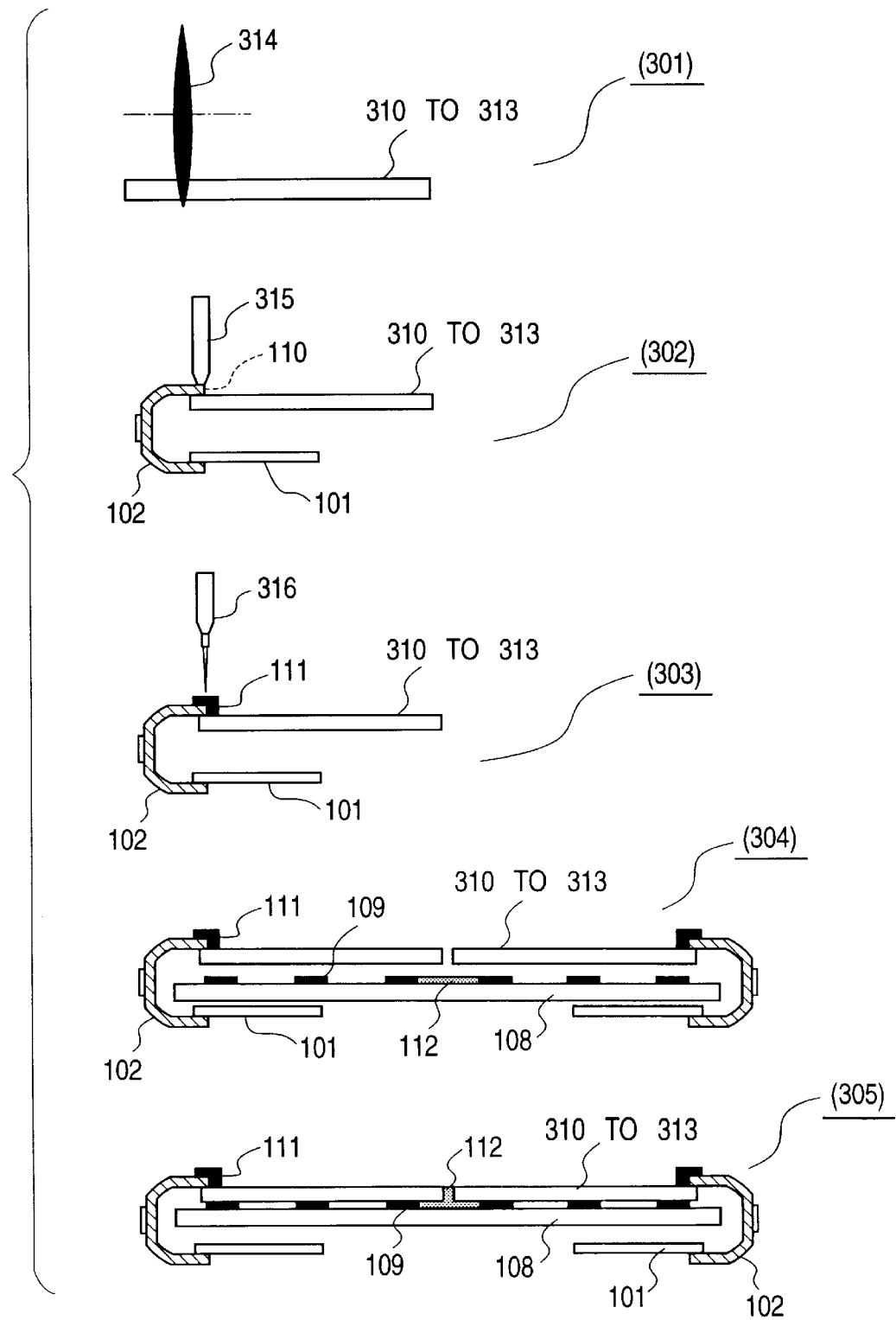

FIG. 9 is a view showing an example of the process for preparing the solid-state image pickup device shown in FIG. 7. The sensor elements 107 are omitted from the illustration. In a step (301), the sensor substrates 310–313 prepared in a thin-film semiconductor process are sliced into a desired size, with a rotary diamond blade 314. In a step (302), the circuit board 101 is connected, with suitable jointing means 315 and through the flexible circuit board 102, to the lead electrode portion 110 of each of the sensor substrate 103–106 of the predetermined size.

Then, in a step (303), the sealant 111 is coated by a dispenser 316, onto the lead electrode portion 110 to which the flexible circuit board 102 is joined. In a step (304), the sensor substrates 310–313 after sealing are so aligned that the pitch of the pixels matches in the two-dimensional directions. Also in the step (304), organic resin 112 is coated on the base member 108 in portions where the adhesive 109 for fixing the sensor substrates and the connecting portions of the sensor substrates come into contact with the base member. Then, in a step (305), the aligned sensor substrates 310–313 are placed on the base member 108 and fixed thereto. In this operation, the organic resin is guided by the capillary phenomenon to and fills the connecting portions.

The filler material may be composed of organic resin of which content in each of sodium and potassium does not exceed 200 ppm.

Figure 10:
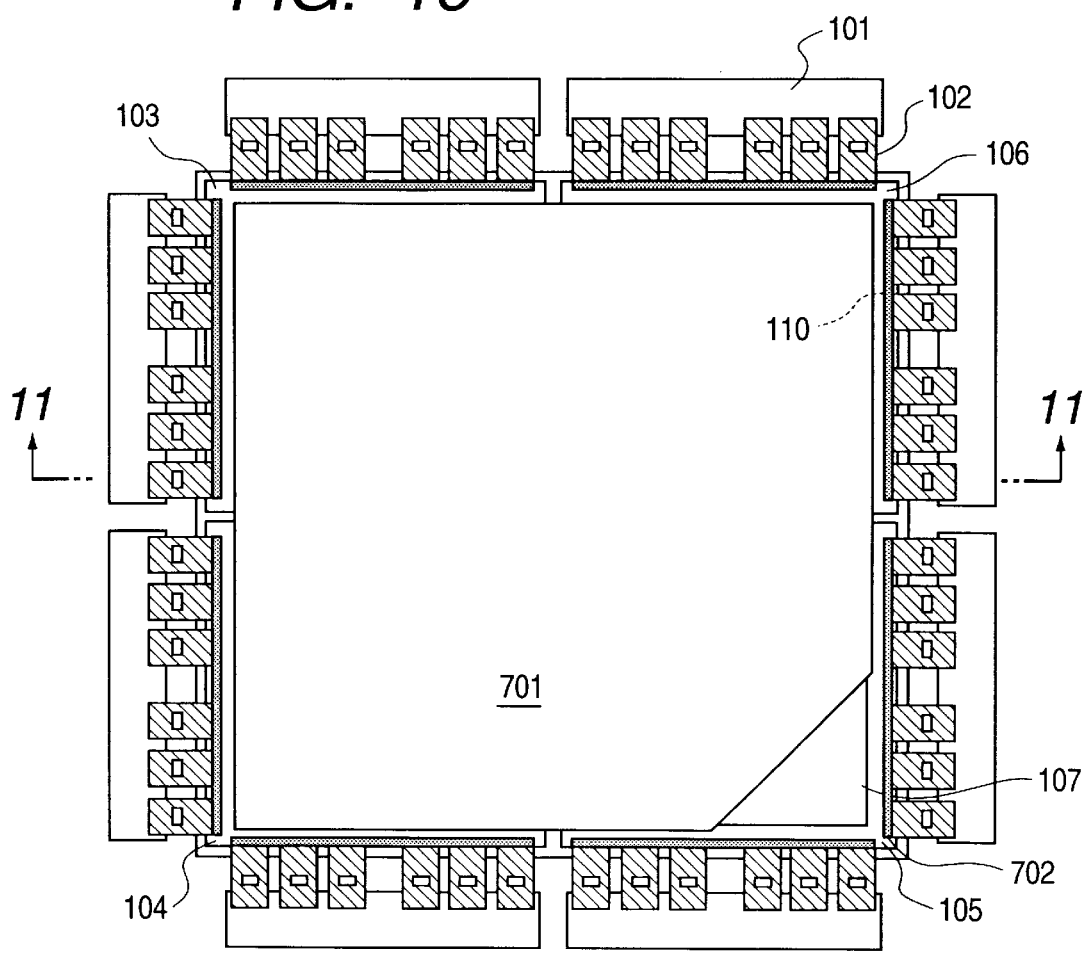
Figure 11:
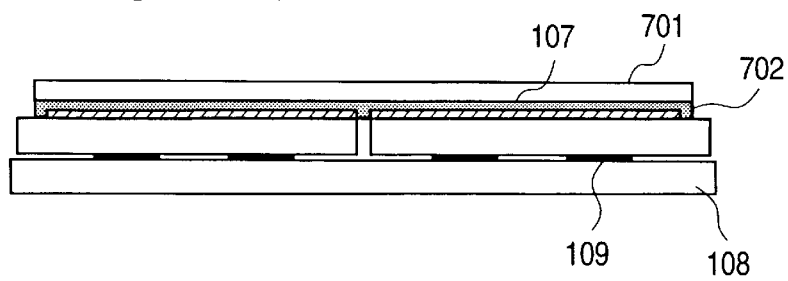

FIG. 10 is a plan view of a preferred embodiment of the solid-state image pickup device capable of reading X-ray information, and FIG. 8 is a schematic cross-sectional view thereof, wherein shown are circuit boards 101, flexible circuit boards 102, lead electrode portions 110 provided on the sensor substrates, sensor substrates 103–106 on which sensor elements 107 are formed, a base member 108 for supporting the sensor substrates 103–106, and an adhesive material 109 for fixing the sensor substrates 103–106 to the base member 108. The sensor substrates 103–106 are so aligned that the pitch of the pixels matches in the two-dimensional directions, and are fixed to the base member 108. There are further shown a fluorescent plate 701 for converting X-ray into visible light, and an adhesive material 702 for adhering the fluorescent plate 701 and the sensor substrates 103–106 and also for sealing the lead electrode portions 110. The adhesive material is composed, for example, of organic resin of which chlorine content does not exceed 200 ppm.

Figure 12:
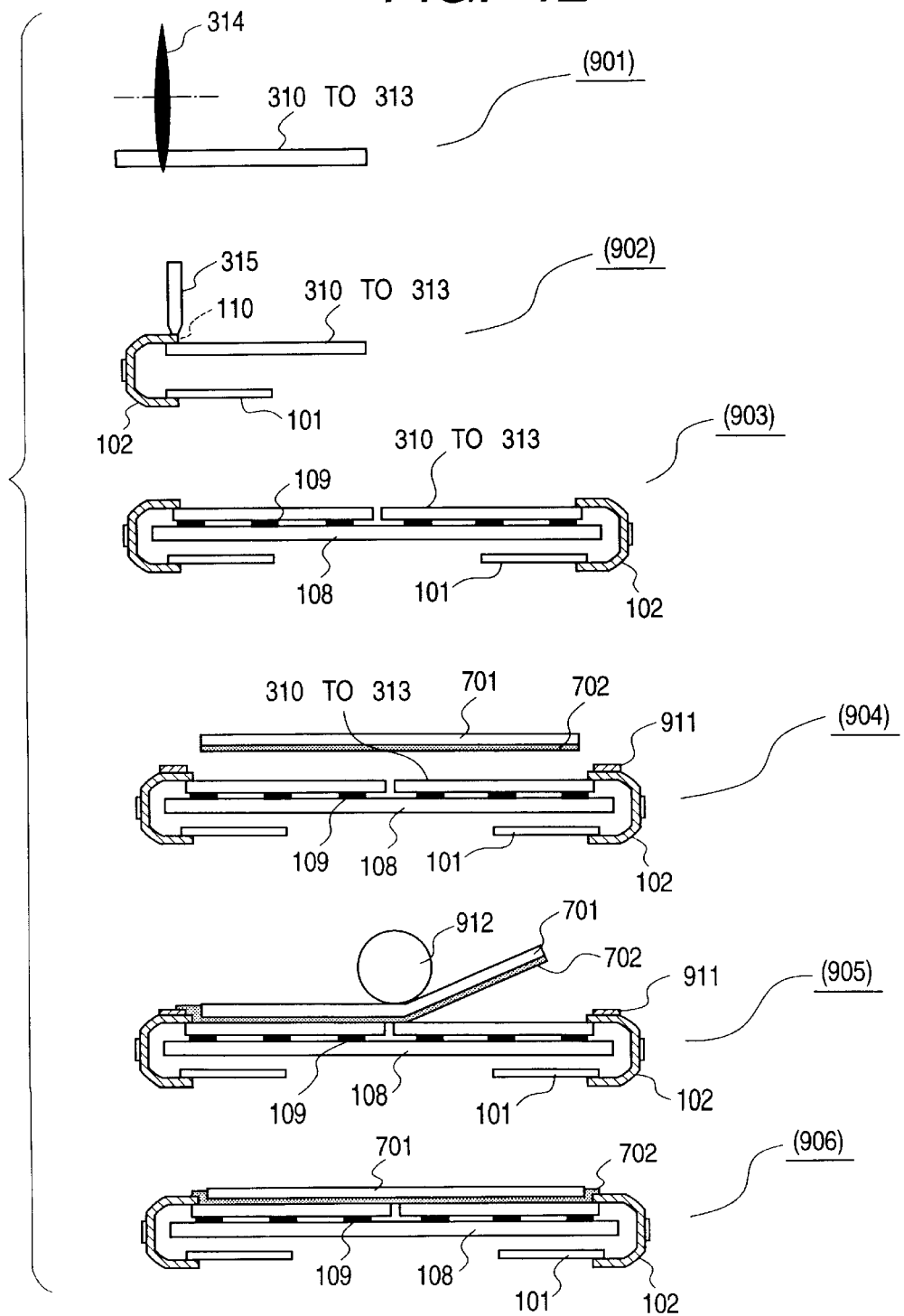

FIG. 12 is a view showing an example of the process for preparing the solid-state image pickup device (X-ray image pickup device) shown in FIG. 10. In a step (901), the sensor substrates 310–313 prepared in a thin-film semiconductor process are sliced into a desired size, with a rotary diamond blade 314. In a step (902), the circuit board 101 is connected, with suitable jointing means 315 and through the flexible circuit board 102, to the lead electrode portion 110 of each of the sensor substrate 103–106 of the predetermined size.

Then, in a step (903), the four sensor substrates are so aligned that the pitch of the pixels matches in the two-dimensional directions, then placed on the base member 108 coated in advance with the adhesive material and fixed thereto. In a step (904), areas of the flexible circuit board 102 not requiring sealing are masked with a polyimide tape 911. Then the fluorescent plate 701 coated over the entire area with an adhesive material for example by spraying is placed on the four sensor substrates.

Then, in a step (905), the adhesion is achieved under a constant pressure applied by a roller 912. After the adhesion, in a step (906), there is removed the masking tape 911, on which the overflowing adhesive material is present. In FIG. 12, the sensor elements are omitted from the illustration.

Figure 13:
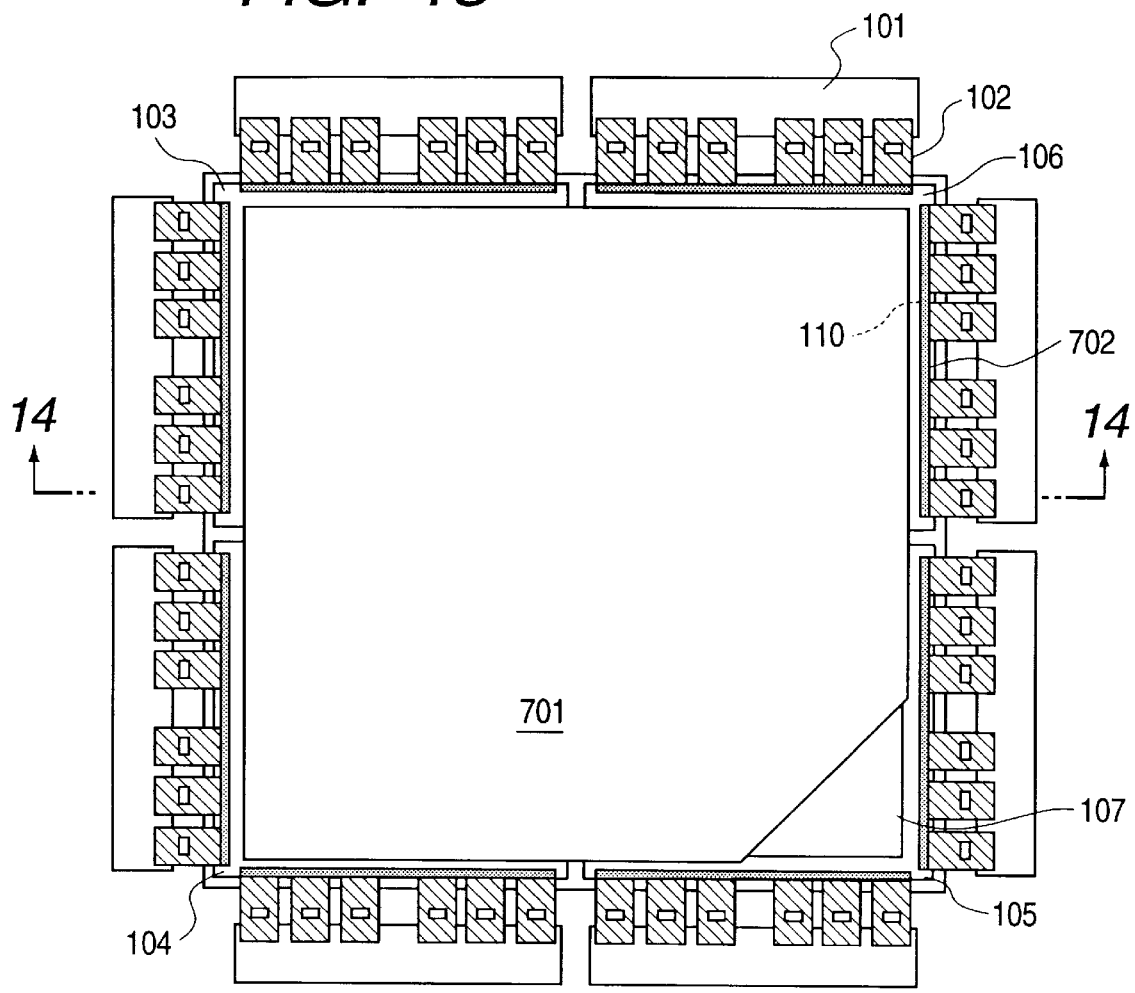
Figure 14:
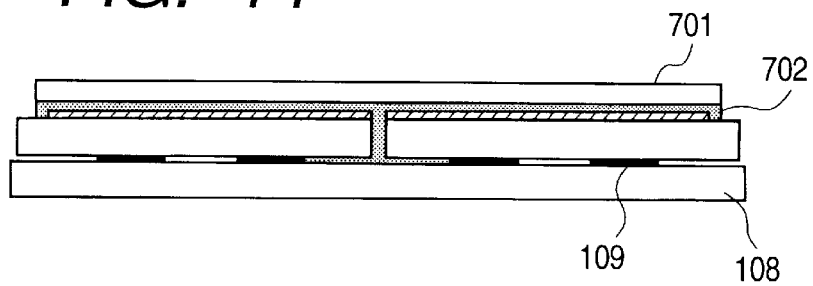

FIG. 13 is a schematic plan view of another embodiment of the X-ray image pickup device of the present invention, and FIG. 14 is a schematic cross-sectional view thereof, wherein shown are circuit boards 101, flexible circuit boards 102 and lead electrode portions 110 provided on the sensor substrates. The sealant (not shown) is used at the junction of the flexible circuit board 102 and the lead electrode portion 110, for preventing the corrosion thereof, and is generally composed of silicone resin. There are also shown sensor substrates 103–106 on which sensor elements 107 are formed, a base member 108 for supporting the sensor substrates 103–106, and an adhesive material 109 for fixing the sensor substrates 103–106 to the base member 108.

The sensor substrates 103–106 are so aligned that the pitch of the pixels matches in the two-dimensional directions, and are fixed to the base member 108. In the present embodiment there are further shown a fluorescent plate 701 for converting X-ray into visible light, and an adhesive material 702 for adhering the fluorescent plate 701 and the sensor substrates 103–106 and also for serving as the filler material for filling the connecting portions of the four sensor substrates. The adhesive material has a chlorine content not exceeding 200 ppm. It is naturally possible also to adhere the fluorescent plate after the filler material is separately provided.

Figure 15:
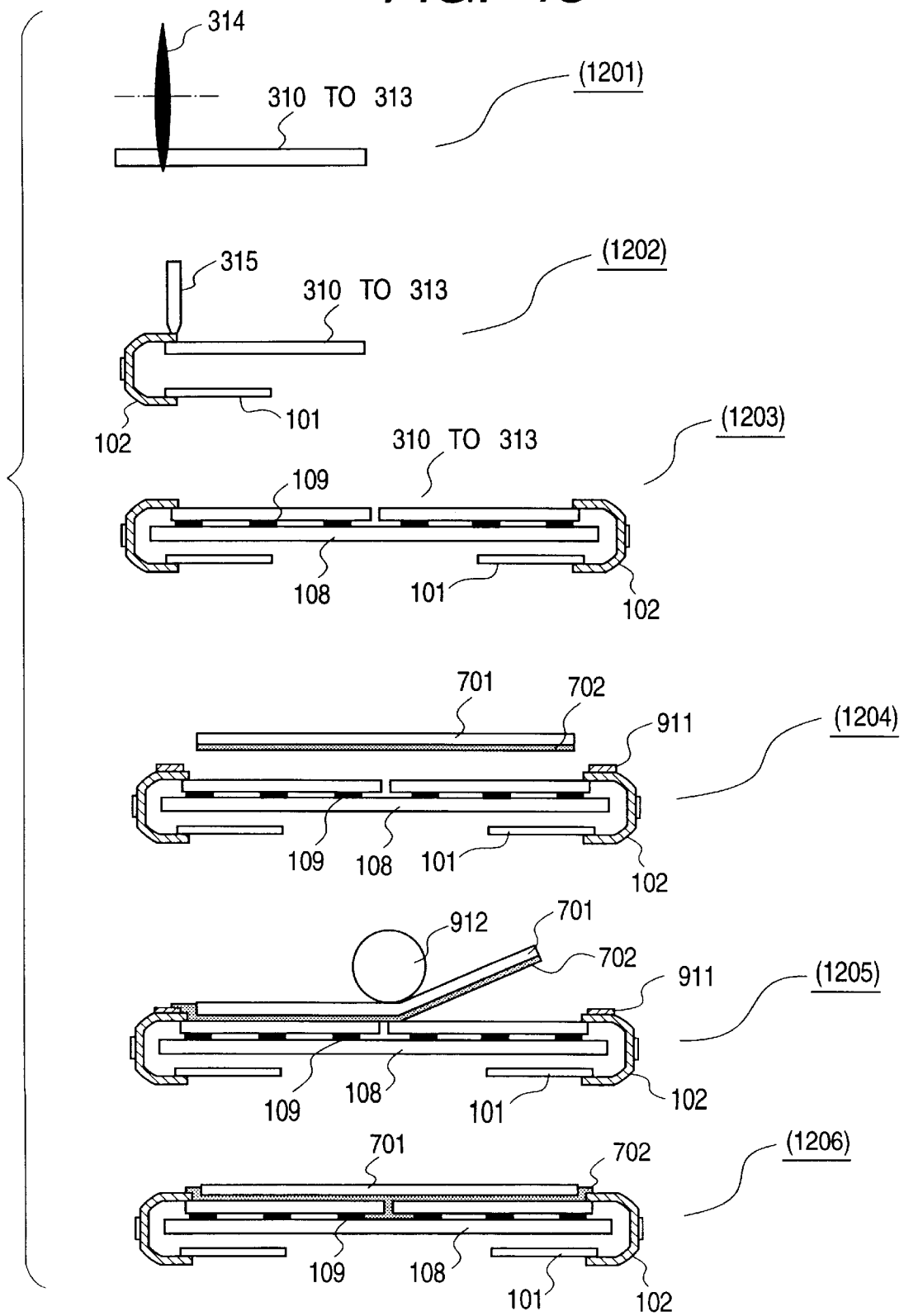
Figure 6:
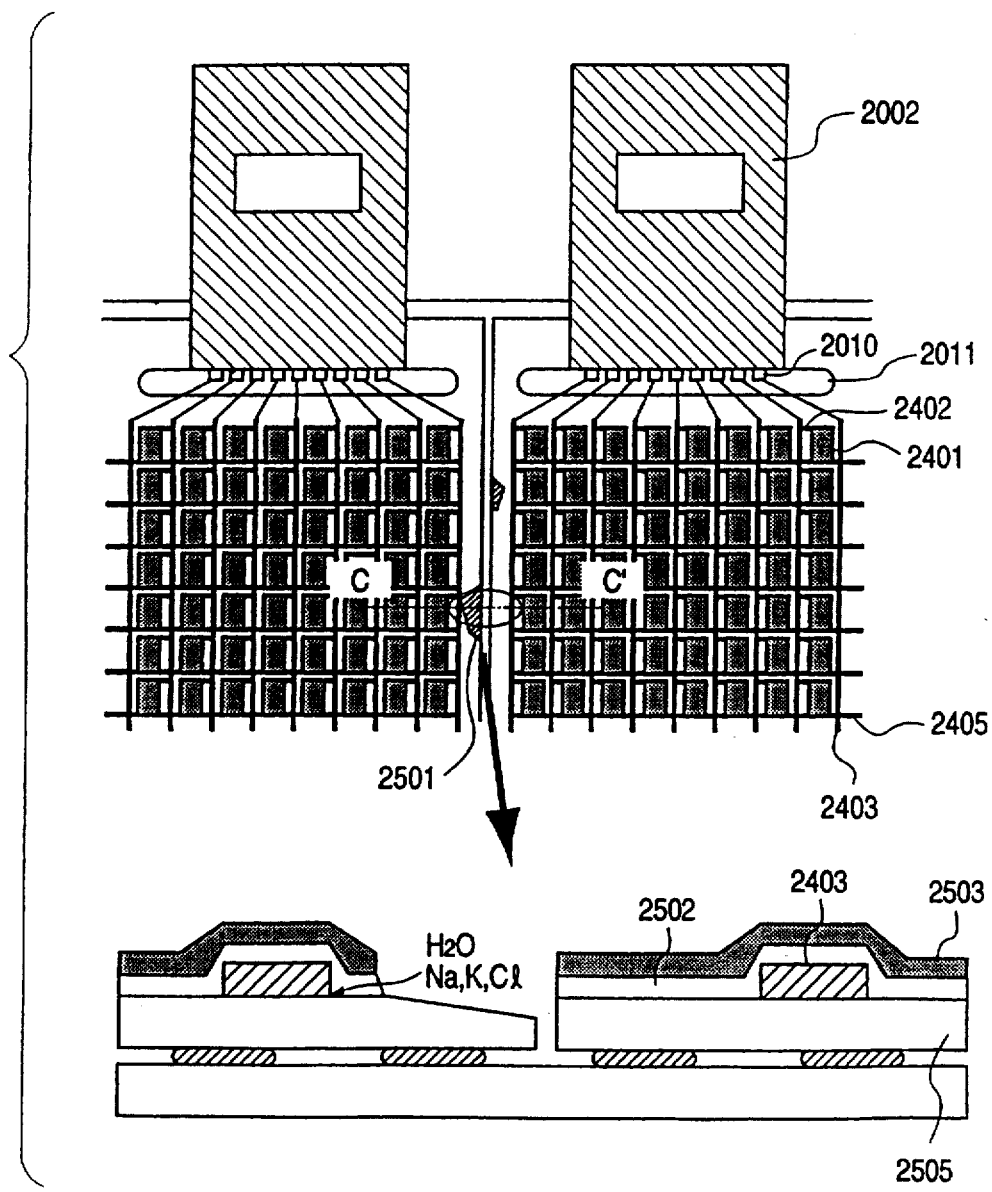

FIG. 15 is a view showing an example of the process for preparing the X-ray image pickup device shown in FIG. 13. In FIG. 15, the sensor elements 107 are omitted from the illustration, for the purpose of simplicity. In a step (1201), the sensor substrates 310–313 prepared in a thin-film semiconductor process are sliced into a desired size, with a rotary diamond blade 314. In a step (1202), the circuit board 101 is connected, with suitable jointing means 315 and through the flexible circuit board 102, to the lead electrode portion 110 of each of the sensor substrate 103–106 of the predetermined size.

Then, in a step (1203), the four sensor substrates are so aligned that the pitch of the pixels matches in the two-dimensional directions, then placed on the base member coated in advance with the adhesive material and fixed thereto. In a step (1204), areas of the flexible circuit board 102 not requiring sealing are masked with a polyimide tape 911. Then the fluorescent plate 701 coated over the entire area with an adhesive material 702, for example, by spraying is placed on the four sensor substrates.

Then, in a step (1205), the adhesion is achieved under a constant pressure applied by a roller 912. In this operation, the adhesive material is filled into the connecting portions of the four sensor substrates. In a step (1206), there is removed the masking tape 911, on which the overflowing adhesive material is present.

EXAMPLE 1

In the following there are shown examples of the devices shown in FIGS. 7 and 8. Solid-state image pickup devices employing five organic resins, different in chlorine content, were tested for the corrosion of wirings, in a test for 1000 hrs. under 40° C. and 90% RH. As a result, a shown in Table 1, the organic resins having a chlorine content not exceeding 200 ppm did not show the corrosion of the wirings. These examples only show the organic resins, but any organic or inorganic substance can be employed similarly as long as the chlorine content does not exceed 200 ppm.

TABLE 1

Relation between organic resins of different chlorine contents and corrosion of wiring

| Filler | Cl content (ppm) | Corrosion |
| --- | --- | --- |
| Epoxy A | 27,000 | present |
| Acryl A | 200 | absent |
| Acryl B | 40 | absent |
| Epoxy B | 10 | absent |
| Silicone A | 2 or less | absent |

EXAMPLE 2

In the following there are shown examples of the devices shown in FIGS. 7 and 8. Solid-state image pickup devices employing five organic resins, different in sodium and potassium content, were tested for the corrosion of wirings, in a test for 1000 hrs. under 40° C. and 90% RH. As a result, as shown in Table 2, the organic resins having a content not exceeding 200 ppm in each of sodium and potassium did not shown the corrosion of the wirings. These examples only show the organic resins, but any organic or inorganic substance can be employed similarly as long as the content in each of sodium and potassium does not exceed 200 ppm.

TABLE 2

Relationship between organic resins of different sodium/potassium contents and corrosion of wirings

| Filler | K content (ppm) | Na content (ppm) | Total content (ppm) | Corrosion |
| --- | --- | --- | --- | --- |
| Acryl C | 500 | 600 | 1100 | present |
| Acryl D | 200 | 200 | 400 | absent |
| Epoxy C | 5 | 5 | 10 | absent |
| Silicon B | 2 or less | 2 or less | 4 or less | absent |

As explained in the foregoing, the present invention allows to provide a solid-state image pickup device formed by arranging plural substrates, each bearing a plurality of image sensor elements, in a planar manner on a supporting substrate for supporting the first-mentioned substrates, wherein the connecting portions of thus arranged substrates are filled with an organic or inorganic substance of which content in chlorine or in each of sodium and potassium does not exceed 200 ppm, thereby avoiding the corrosion in the wirings resulting from chipping of the substrate and providing a defect-free panel of high reliability.

Also the present invention allows to provide an X-ray image pickup device of a configuration in which a fluorescent member for converting X-ray into visible light is adhered, with an adhesive or viscous substance, onto a sensor substrate bearing a plurality of photoelectric converting elements and thin film transistors, wherein an electrical connecting portion between a lead electrode portion for scanning drive and image signal output, provided on the sensor substrate, an integrated circuit board is sealed with the above-mentioned adhesive or viscous substance, of which content in chlorine or in each of sodium and potassium does not exceed 200 ppm, thereby simplifying the process and providing a panel of low cost.

It is naturally desirable that the content in each of chlorine, sodium and potassium does not exceed 200 ppm.

What is claimed is:

1. A solid-state image pickup device comprising plural substrates, each bearing a plurality of photoelectric converting elements, arranged in a planar manner on a supporting substrate, wherein, between said arranged substrates, filled is an organic or inorganic substance of which content in chlorine does not exceed 200 ppm.

2. A solid-state image pickup device comprising plural substrates, each bearing a plurality of photoelectric converting elements, arranged in a planar manner on a supporting substrate, wherein, between said arranged substrates, filled is an organic or inorganic substance of which content in each of sodium and potassium does not exceed 200 ppm.

3. A solid-state image pickup device of a configuration comprising a wavelength converting member for converting X-ray into visible light which is adhered, with an adhesive or viscous substance, to a sensor substrate bearing a plurality of photoelectric converting elements and thin film transistors, wherein an electrical connecting portion between a lead electrode portion for scanning drive and image signal output, provided on said sensor substrate, and an integrated circuit board is sealed with said adhesive or viscous substance, of which content in chlorine does not exceed 200 ppm.

4. A solid-state image pickup device according to claim 3, wherein said wavelength converting member includes a fluorescent member.

5. A solid-state image pickup device according to claim 3, wherein said sensor substrate is provided in plural units on said supporting substrate, and filler material is provided between said sensor substrates in mutually adjacent relationship.

6. A solid-state image pickup device according to claim 5, wherein said filler material is the adhesive or viscous substance for adhering said wavelength converting member.

7. A solid-state image pickup device according to claim 5, wherein said filler material contains chlorine or an element selected from a group consisting of sodium and potassium in an amount not exceeding 200 ppm.

8. A solid-state image pickup device of a configuration comprising a wavelength converting member for converting X-ray into visible light which is adhered, with an adhesive or viscous substance, to a sensor substrate bearing a plurality of photoelectric converting elements and thin film transistors, wherein an electrical connecting portion between a lead electrode portion for scanning drive and image signal output, provided o n said sensor substrate, and an integrated circuit board is sealed with said adhesive or viscous substance, of which content in each of sodium and potassium does not exceed 200 ppm.

9. A solid-state image pickup device according to claim 8, wherein said wavelength converting member includes a fluorescent member.

10. A solid-state image pickup device according to claim 8, wherein said sensor substrate is provided in plural units on said supporting substrate, and a filler material is provided between said sensor substrates in mutually adjacent relationship.

11. A solid-state image pickup device according to claim 10, wherein said filler material is the adhesive or viscous substance for adhering said wavelength converting member.

12. A solid-state image pickup device according to claim 10, wherein said filler material contains chlorine or an element selected from a group consisting of sodium and potassium in an amount not exceeding 200 ppm.

13. A solid-state image pickup device comprising plural substrates, each bearing a plurality of photoelectric converting elements arranged in mutually arranged manner on a supporting substrates, wherein, between said mutually adjacent substrates, provided is a filler material of which content in at least an element selected from a group consisting of chlorine, sodium and potassium does not exceed 200 ppm.

14. A solid-state image pickup device according to claim 13, wherein the selected element is chlorine.

15. A solid-state image pickup device according to claim 13, wherein the selected elements are sodium and potassium.

16. A solid-state image pickup device according to claim 13, wherein the selected elements are chlorine, sodium and potassium.

17. A solid-state image pickup device according to claim 13, further comprising a wavelength converting member at the light entrance side of said photoelectric converting elements, wherein said wavelength converting member is provided with an adhesive or viscous material of which content in at least an element selected from a group consisting of chlorine, sodium and potassium does not exceed 200 ppm.

18. A solid-state image pickup device according to claim 17, wherein said wavelength converting member includes a fluorescent member.

19. A solid-state image pickup device according to claim 17, wherein the selected element is chlorine.

20. A solid-state image pickup device according to claim 17, wherein the selected elements are sodium and potassium.

21. A solid-state image pickup device according to claim 17, wherein the selected elements are chlorine, sodium and potassium.

22. A solid-state image pickup device comprising a wavelength converting member at the light entrance side a substrate bearing a plurality of said photoelectric converting elements, wherein said wavelength converting member is provided with an adhesive or viscous material of which content in at least an element selected from a group consisting of chlorine, sodium and potassium does not exceed 200 ppm.

23. A solid-state image pickup device according to claim 22, wherein said wavelength converting member includes a fluorescent member.

24. A solid-state image pickup device according to claim 22, wherein the selected element is chlorine.

25. A solid-state image pickup device according to claim 22, wherein the selected elements are sodium and potassium.

26. A solid-state image pickup device according to claim 22, wherein the selected elements are chlorine, sodium and potassium.

* * * * *

UNITED STATES PATENT AND TRADEMARK OFFICE
CERTIFICATE OF CORRECTION

PATENT NO.   : 5,990,505
DATED        : November 23, 1999
INVENTOR(S)  : KENJI KAJIWARA Page 1 of 2

It is certified that error appears in the above-identified patent and that said Letters Patent is hereby corrected as shown below:

ON THE COVER PAGE:

Insert -- [30] Foreign Application Priority Data
             Feb. 20, 1997   Japan   9-036132--.

Figure 1A:
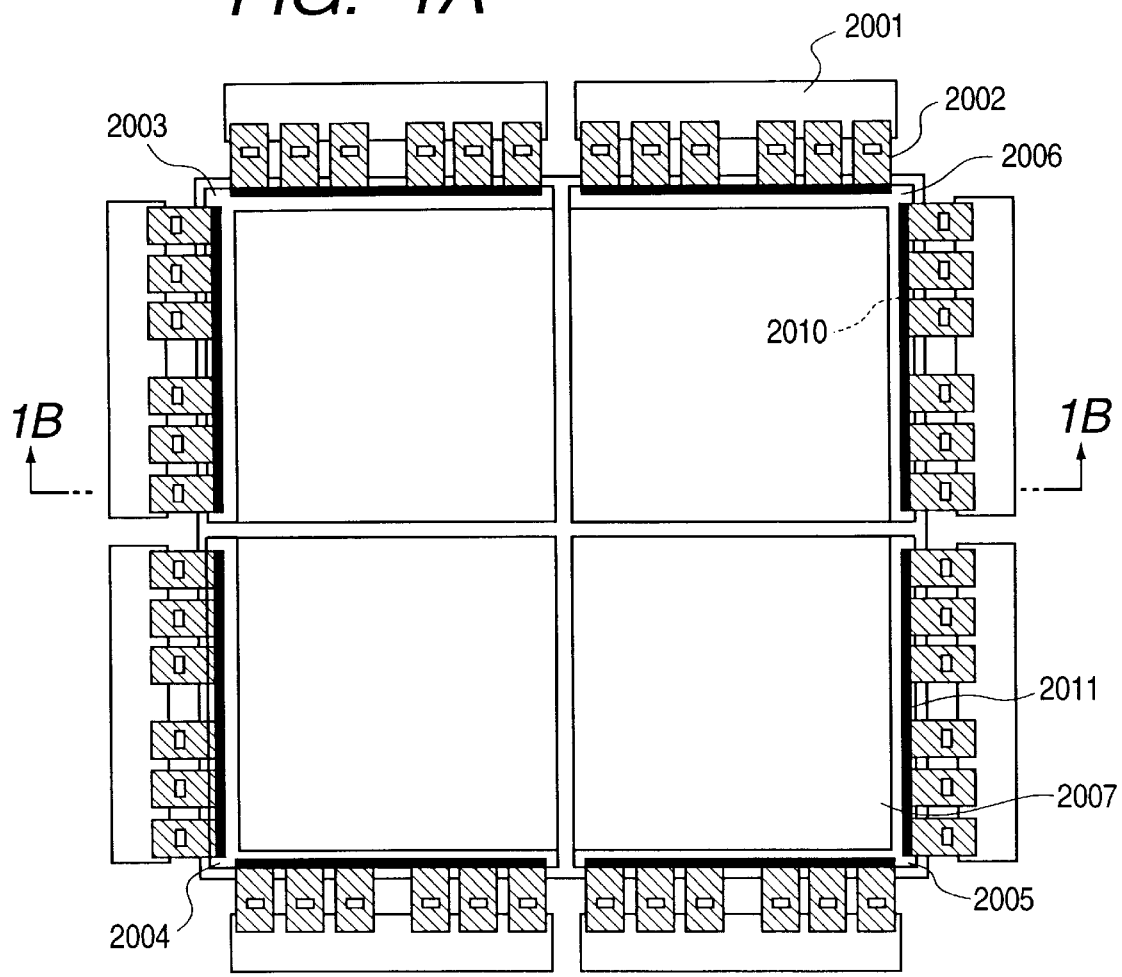
FIGS. 1A, 3A, 7, 10 and 13 are schematic plan views showing examples of the solid-state image pickup device.
Figure 1B:
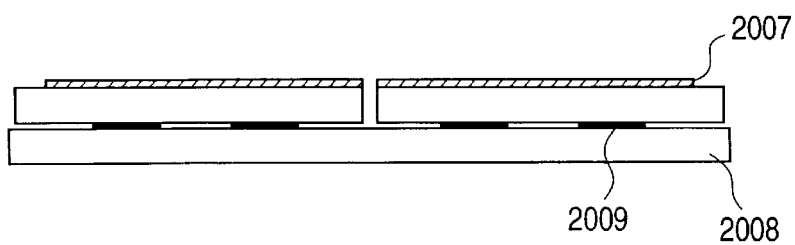
FIGS. 1B, 3B, 8, 11 and 14 are schematic cross-sectional views showing examples of the solid-state image pickup device.
Figure 2:
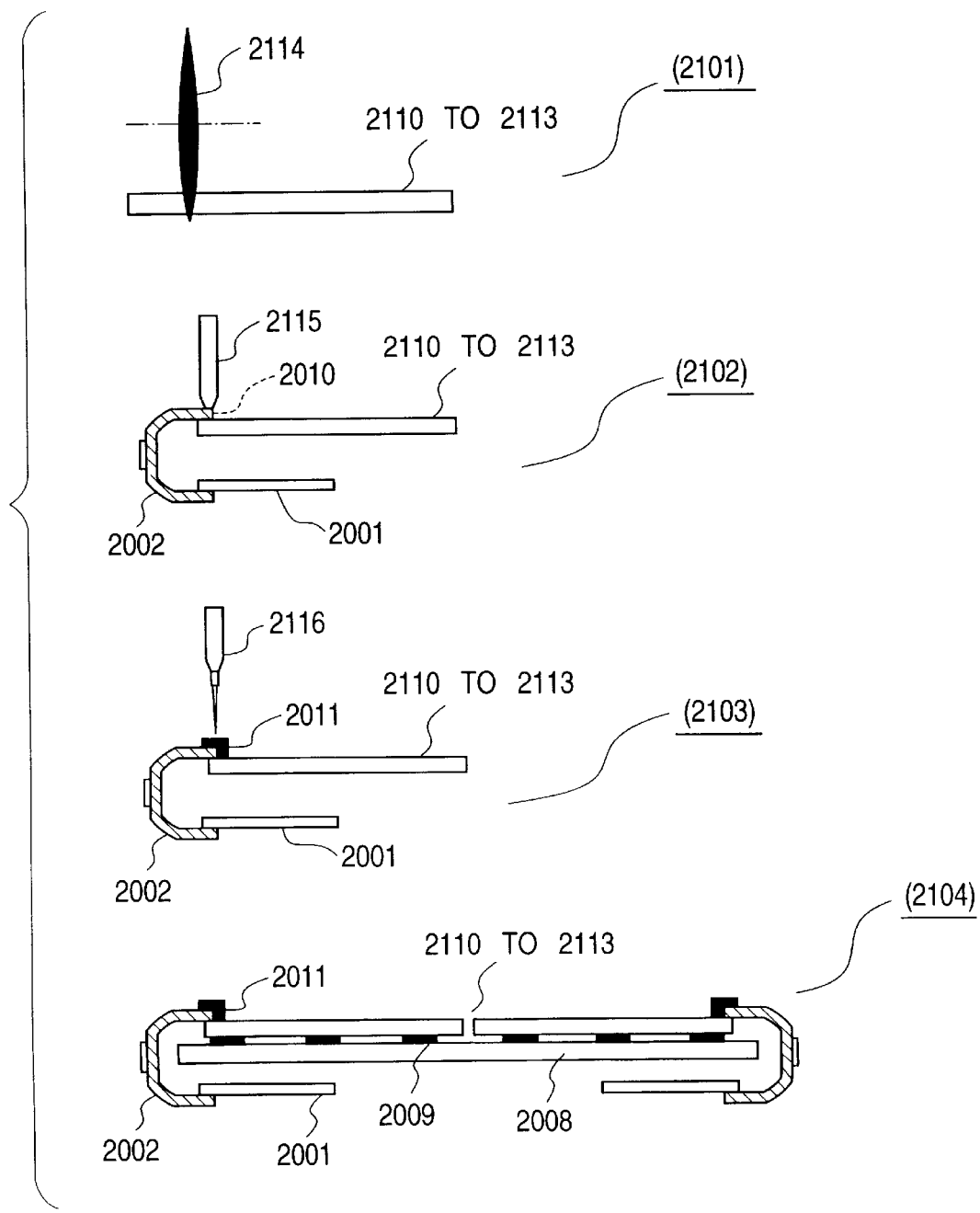
Figure 3A:
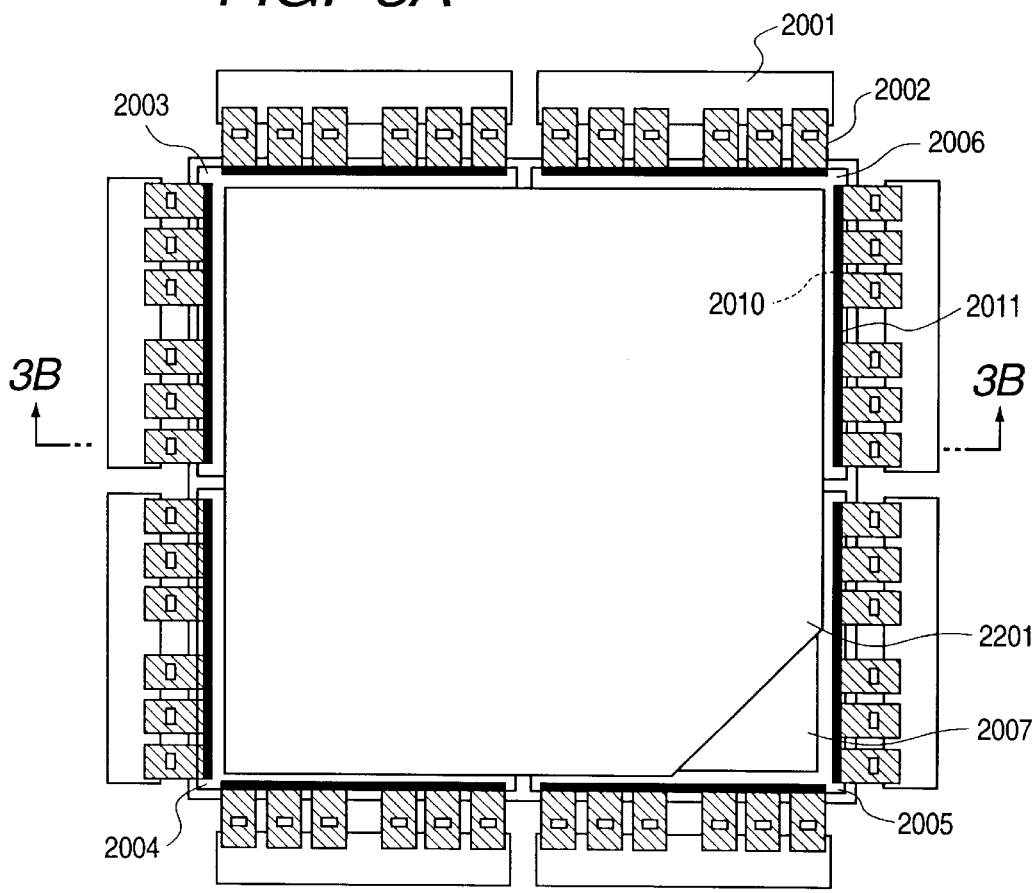
Figure 3B:
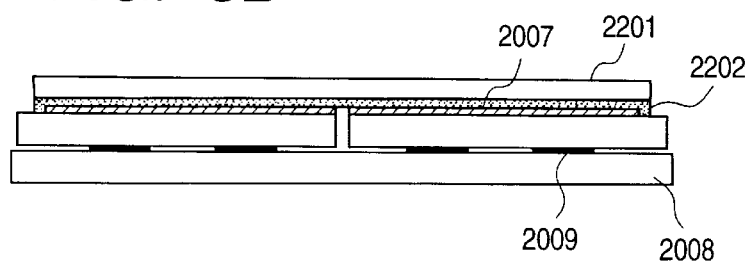
Figure 5:
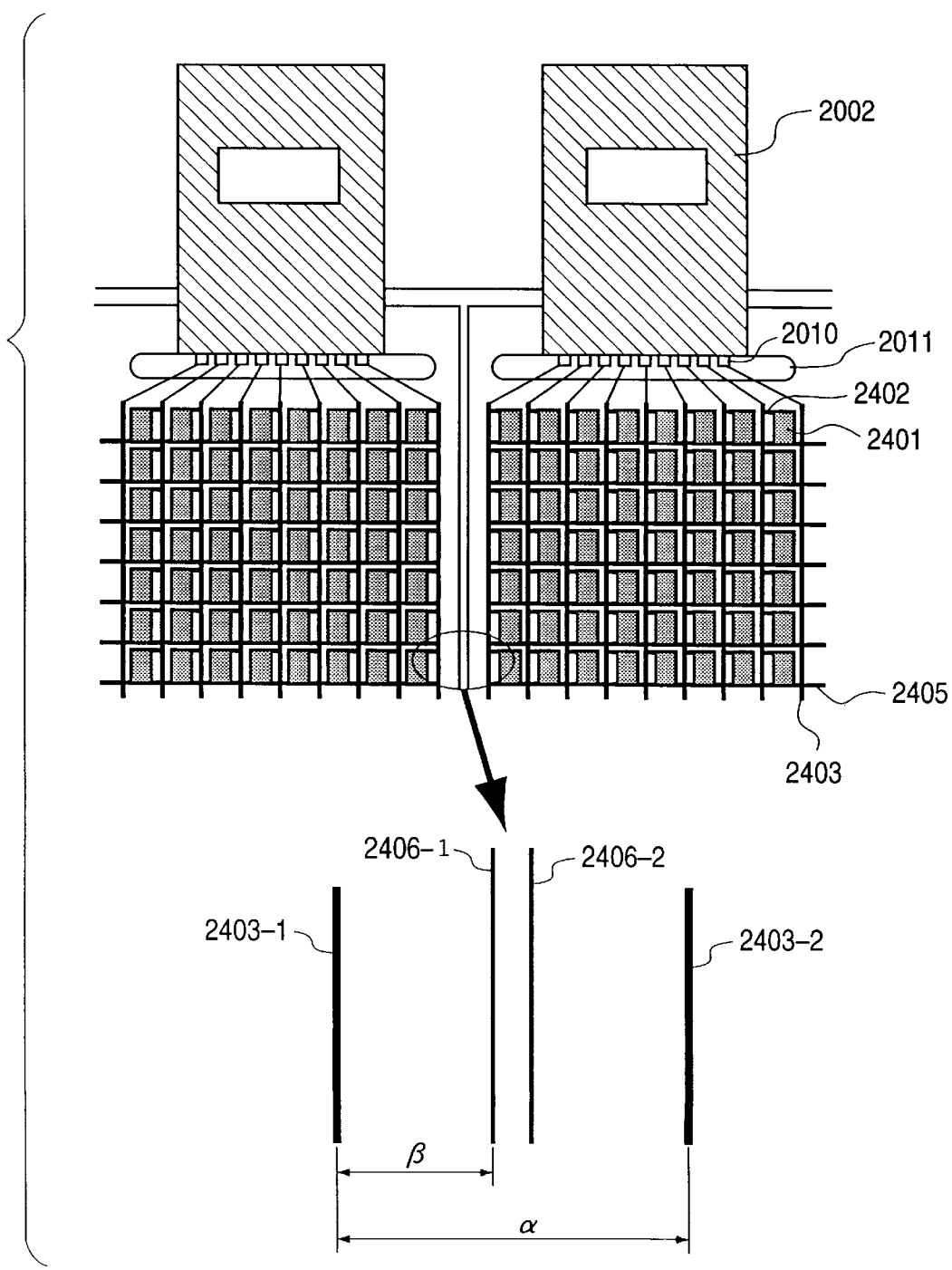
FIGS. 5 and 6 are views showing the state between the neighboring substrates.
Figure 6:
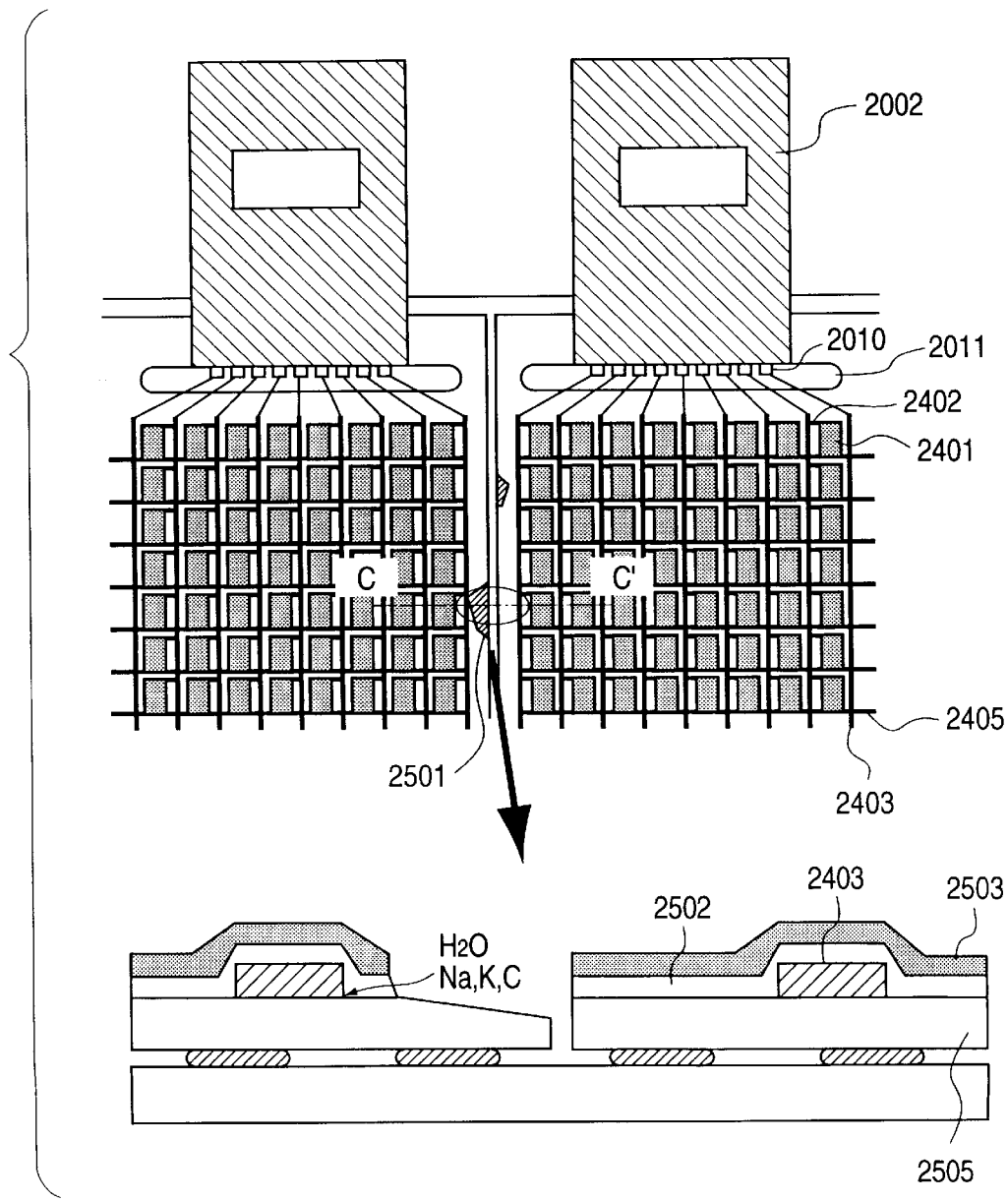

IN THE DRAWINGS:

Fig. 6 in Sheet 6 should be replaced with the attached amended Fig. 6.

COLUMN 1

Line 30, "However" should read --However,--.

COLUMN 4

Line 19, "Also" should read --Also,--; and
    Line 25, "bubbl es" should read --bubbles--.

COLUMN 6

Line 30, "jointing" should read --joining--.

COLUMN 8

Line 17, "a" should read --as--;
    Line 38, "following" should read --following,--; and
    Line 45, "shown" should read --show--.

UNITED STATES PATENT AND TRADEMARK OFFICE
CERTIFICATE OF CORRECTION

PATENT NO. : 5,990,505
DATED : November 23, 1999
INVENTOR(S) : KENJI KAJIWARA

It is certified that error appears in the above-identified patent and that said Letters Patent is hereby corrected as shown below:

COLUMN 9

Line 65, "o n" should read --on--.

Signed and Sealed this

Tenth Day of April, 2001

Attest:

NICHOLAS P. GODICI

Attesting Officer     Acting Director of the United States Patent and Trademark Office